United States Patent [19]

Goel

[11] Patent Number: 5,139,918
[45] Date of Patent: Aug. 18, 1992

[54] PHOTORESIST SYSTEM AND PHOTOETCHING PROCESS EMPLOYING AN I-LINE PEAK LIGHT SOURCE

[75] Inventor: Atul Goel, Ft. Collins, Colo.

[73] Assignee: Hewlett-Packard Company, Palo Alto, Calif.

[21] Appl. No.: 530,220

[22] Filed: May 30, 1990

Related U.S. Application Data

[63] Continuation-in-part of Ser. No. 163,336, Mar. 2, 1988, abandoned.

[51] Int. Cl.$^5$ ............... G03F 7/022; G03F 7/095; G03F 7/26
[52] U.S. Cl. ............... 430/166; 430/312; 430/311; 430/271; 430/273; 430/314; 430/165; 430/156
[58] Field of Search ............... 430/270, 271, 273, 311, 430/312, 394, 500, 156

[56] References Cited

U.S. PATENT DOCUMENTS

| | | | |
|---|---|---|---|
| 4,362,809 | 12/1982 | Chen et al. | 430/312 |
| 4,618,565 | 10/1986 | White et al. | 430/271 |
| 4,681,430 | 7/1987 | Goel et al. | 355/77 |
| 4,719,166 | 1/1988 | Blevins et al. | 430/166 |

FOREIGN PATENT DOCUMENTS 0154932  9/1985  European Pat. Off. .
1622302 10/1970  Fed. Rep. of Germany .

OTHER PUBLICATIONS

Bassons et al.—"Acridine and Acidine Derivatives in Photoresist..." IBM Tech. Dis. Bull. vol 23(7B) 1980 pp. 3387–3390.

Brewer et al. "The Reduction of the Standing-Wave Effect in Positive Photoresists" J. of Applied Photograhic Eng. vol. 7(6) Dec. 1981.

*Primary Examiner*—Charles L. Bowers, Jr.
*Assistant Examiner*—Mark F. Huff
*Attorney, Agent, or Firm*—Guy J. Kelley

[57] ABSTRACT

The disclosed photoresist process employs an i-line peak containing light source, such as that of the mercury spectrum, in conjunction with a dye capable of both absorbing i-line light and withstanding subsequent those baking procedures employed in producing portable-conforming-mask (PCM) photoetchings. Applicant has found that a series of butadiene or bromine substituted butadiene dyes in general, and N,N'-Dibutyl-N,N'-Di (1-(4,4-dicyano-1,3-butadiene))-1,6-hexanediamine, in particular, are particularly well suited to these purposes. Such dyes are most preferably used in conjunction with a second dye capable of absorbing of a non-i-line light source used to expose a bottom photoresist layer of a PCM system.

7 Claims, 3 Drawing Sheets

PHOTORESIST SYSTEM AND PHOTOETCHING PROCESS EMPLOYING AN I-LINE PEAK LIGHT SOURCE

RELATED PATENT APPLICATIONS

This patent application is a continuation-in-part of U.S. patent application 163,336 which was filed on Mar. 2, 1988, now abandoned.

1. Field of the Invention

This invention generally relates to photoresist processes for etching semiconductor materials. More particularly it relates to photoresist processes wherein absorbent dyes are employed to improve line resolution and uniformity, especially in multilevel photoresist processes.

2. Background of the Invention

Great efforts have been directed toward increasing the resolution of photoresist processes because, among other things, greater resolution implies the ability to place both a greater number of circuits and smaller devices on an integrated circuit chip. Such increased circuit density and small devices in turn, imply increased speed in such integrated circuits.

Modern optical projection printing processes can resolve lines of approximately 1 micron or smaller width in several kinds of photoresist materials with good linewidth control, provided that flat substrates are employed. Unfortunately, a number of control problems are introduced into these processes by variations in photoresist thickness and by optical reflections during exposure of a photoresist material deposited in a substrate having surface topography. If the resist thickness is non-uniform, there will be non-uniform exposure and this results in unwanted variable linewidths. The resulting patterns may well have sloping walls; hence, the width of the resist pattern at the surface of the substrate may vary with resist thickness. Moreover, since a layer of material deposited on a non-flat surface will inherently vary in thickness, substrate topography will inherently produce linewidth variations. Relatively thicker resist layers are sometimes used to compensate for such problems, but since the time required to expose a resist is generally an increasing function of resist thickness, an increased amount of light is required to expose an increased amount of resist. Moreover, because or certain resonant effects which are associated with exposures using monochromatic light sources, which effects are more fully described in subsequent portions of this patent disclosure, exposure time may also include a harmonic component which varies between successive maximum and minimum values with resist thickness variations.

Light reflections cause another set of problems. For example, reflections from a substrate/resist interface will produce variations in light intensity in the resist during exposure and such variations usually result in non-uniform linewidths. In other words, incoming light will scatter from the interface into regions of the resist where no exposure is intended. This results in a broadening or blooming of linewidth. Reflections of this type are particularly apt to occur in cases where metal interconnects are also deposited on a semiconductor substrate because such metal interconnects produce not only surface topography and but also regions of high reflectivity. The amount of such scattering and reflection may also vary from chip to chip and thereby create undesirable linewidth variations from chip to chip.

Other scattering type problems have arisen when polychromatic incident light is passed through a resist layer. To minimize such problems, monochromatic or quasi-monochromatic light is commonly used in most resist projection printing techniques. Many sources of such monochromatic light have been suggested, but each is accompanied by certain general, and certain particular, disadvantages. Generally speaking, the effect of interface reflections on resolution are particularly troublesome when monochromatic (or quasi-monochromatic) light is used to expose a resist because when monochromatic light reflects from a substrate/resist interface, the reflected light interferes with the incident light and forms standing waves within the resist. In the case of highly reflective substrate regions, a resulting large standing wave ratio will create thin layers of under-exposed resist at the standing wave minima. These under-exposed layers can prevent complete resist development and ultimately cause jagged line profiles. Part of the reflected light may also reflect back to the substrate from the top surface of the resist. Such multiple reflection of the incident light between the top and bottom surfaces of the resist layer usually results in a resonance which further effects the light intensity within the resist and ultimately produces unwanted linewidth variations. However it has long been recognized that photoresist linewidth control problems due to such scattering and reflection from the substrate/resist interface can be minimized by reducing or eliminating substrate reflections. For example, at least one literature reference (see H. A. Koury and K. V. Patel, "Anti-Interference Phenomena Coating", IBM Technical Disclosure Bulletin, Vol. 13, No. 1, page 38, June 1970) teaches the use of a thin ultraviolet light absorbing layer containing a dye such as methyl orange or methanic yellow deposited at the substrate-resist interface to reduce such light reflections.

Some of the problems more specifically associated with substrate surface topography in portable-conformable-mask (PCM) systems are addressed in an article entitled "Portable conformable mask—a hybrid near-ultraviolet and deep-ultraviolet patterning technique" by B. J. Lin in SPIE Vol. 174, Developments in Semiconductor Microlithography IV, page 114 (1979). This article teaches that a thick bottom layer (e.g., 1–3 micron) of polymethyl methacrylate (PMMA) can be deposited in a substrate to produce a planar surface upon which a thin (e.g., 0.2 micron) layer of a second resist is deposited. The top resist is exposed (e.g., by a projection printing technique) to a near-ultraviolet light, or an electron beam, and then developed to produce a mask which is opaque to polychromatic deep-ultraviolet light. Thereafter, the bottom layer PMMA is exposed through the mask with deep-ultraviolet light and then developed to produce the desired resist pattern. The resulting polychromatic deep-ultraviolet exposure significantly reduces problems associated with substrate surface topography Unfortunately, some reflection problems are not solved by the technique taught by the above references Therefore, in order to solve certain other problems introduced into PCM systems by unwanted light reflections, and thereby further improve line resolution. Other techniques were developed to simultaneously address problems caused by interface reflectivity and by substrate surface topography. One such advance in this technology is fully described in U.S. Pat. No. 4,362,809 ("the 809 patent") and its teachings are incorporated by reference into this patent disclosure. The 809 patent describes a modified portable—conformable-mask ("PCM") technique wherein a top resist layer is selected to be sensitive at wavelengths outside the range in which the bottom resist is sensitive. In other words the light used to expose the top resist was specifically selected to be in a range in which the top resist is sensitive and the bottom resist is not. A g-line light source having a wavelength of approximately 436 nm was selected. It was employed in what is commonly referred to as an "optical, g-line, step and repeat lithography process". The 809 patent also teaches that the top and bottom resists should be selected to have a nearly equal index of refraction at the g-line wavelength employed in order to avoid reflecting light from the interface between the top and bottom resist layers. As a result of these parameter choices, as well as the thin planar character of the top layer, the incident g-line light, which is projected through a mask onto the top layer, exposes the top layer with more sharply focussed light, without activating portions of the bottom layer with defocussed light. The PCM system disclosed in the 809 patent has proven to be a very effective technology, especially in production environments where repeatable performance is a primary requirement.

However, in practice, the PCM system disclosed in the 809 patent, as well as most other known portable-conformable-mask photoresist etching processes, can only employ the g-line peak of the mercury spectrum as its monochromatic light source. It is not at all effective where, for example, an h-line or an i-line light source is employed to expose the same PCM system. Unfortunately, g-line technologies such as those disclosed in the 809 patent are not without certain drawbacks. For example, analysis of wide field 5X g-line lenses shown that the curvature of their imaging field restricts their usable depth of focus.

Moreover, many people skilled in this art are of the opinion that no technology based upon a g-line light source will be capable of producing integrated circuits having linewidths any narrower than those currently being achieved by g-line technologies such as those disclosed in the 809 patent. Hence a number of possible successors to optical, g-line step and repeat lithography have been proposed. These proposals have been based upon light sources other than those of the mercury spectrum e.g., various e-beam, x-ray, ion beam and excimer sources as well as upon use of the h-line and i-line peaks of the mercury spectrum. Most of these proposals have been given cool receptions and/or flatly rejected. For example, e-beam tecnnologies generally have been rebuffed because of the present lack of an appropriate sensitive resist. Low source intensity appears to be a major limitation on x-ray lithography technologies. Furthermore, a defect-free x-ray mask manufacturing process has yet to be developed. Excimer laser UV lenses are probably a viable replacement candidate, but they seem to be undergoing their first design iterations very slowly. Other alternative resist schemes e.g., contrast enhancement, inorganic, and image reversal resists also have all received some consideration, but they too have been rejected for various reasons.

As previously noted, technologies based upon monochromatic light sources other than g-line (436 nm) light have been suggested. For example, light sources emanating from the h-line (405 nm) and i-line (365 nm) peaks of the mercury spectrum have been given a great deal of consideration largely because use of such shorter wavelengths inherently implies the possibility of greater resolution.

However, to date, lens makers have been very slow to develop appropriate h-line lenses and no commercially viable h-line technology currently exists because lens makers probably perceive that their customers may well consider any possible advantages of a yet unknown h-line technology, compared to current mainstay g-line technologies, to be too small to warrant the considerable costs of developing the appropriate lens, alignment control and resist systems needed for such an h-line technology.

On the other hand, presently existing 5X and 10X i-line lenses already represent significant improvements in resolution over current g-line lenses. Hence, an i-line system could more quickly provide the capability to make finer lines and hence provide for higher circuit densities (number of pixels). As previously noted, this possibility follows from the fact that resolution of a lens is proportional to the wavelength and inversely proportional to the numerical aperture of the exposure tool. Furthermore, the depth of focus is proportional to the wavelength and inversely proportional to the square of the numerical aperture of the exposure tool for any given wavelength. Therefore, since i-line light has a shorter wavelength than g-line light, i-line systems will inherently provide greater resolution and broader depth of focus, especially in the context of currently available lensmaking technology. Moreover, light output intensity at the i-line for a mercury lamp is higher than the intensity of the g-line. Hence, chemical activity at the i-line would be higher and exposure times would be shorter.

However, and in spite of these all of the above noted tantalizing technical possibilities and inducements, heretofore, no really effective photoetching processes employing an i-line light source have been developed. This failure probably is largely attributable to the fact that no really suitable i-line resists and no really effective i-line absorbing dyes were heretofore known. Some single layer resists were purportedly designed for i-line use, but these proved to be either insufficiently sensitive at the i-line wavelength (365 nm) and/or unstable during post exposure baking processes. Similarly, several g-line light sensitive, multi-layer resist systems such as those disclosed in the 809 have been tried in conjunction with an i-line light source; but these too have proved to be unacceptable. The problem of finding dyes which are capable of both absorbing i-line light to the high degree required by PCM systems and withstanding the baking procedures which are a part of current PCM technologies has proven to be particularly vexing.

SUMMARY OF THE INVENTION

In response to both the potential advantages of an i-line light source in a photoresist process and to the above noted known problems, applicant has developed a photoetching process of the portable-conformable-mask (PCM) variety which employs the i-line peak of the mercury spectrum in conjunction with: (1) an effective i-line sensitive imaging top layer photoresist material and a bottom layer photoresist material which further comprises one or more highly effective i-line-absorbing dye systems. Applicant has found that butadiene or bromine substituted butadiene dyes in general, and N, N′-Dibutyl-N,N′-Di (1-(4,4-dicyano-1 3-butadiene))-1,6-hexanediamine, in particular are particularly well suited as an i-line-absorbing dye system. Such dyes are most preferably used in conjunction with a second dye capable of absorbing a non-i-line light source used to expose a bottom photoresist layer of a PCM system. These dye systems are particularly characterized by their high coefficient of absorption, at, or substantially near, the i-line peak wavelength e.g., 365 nm, plus or minus 25 nm. In the practice of applicant's processes, these wavelength tolerance requirements can be reduced to much lower levels (e.g., plus or minus 3 nm) by the use of certain filters for exposure tool systems which are well known to this art. Typical exposure times for these processes will be from about 200 to about 800 milliseconds and more preferably near 400 milliseconds. Typical i-line light intensities for typical exposures will range from about 200 millijoules to about 600 millijoules per $cm^2$.

By way of example, only a light intensity of about 400 millijoules per $cm^2$ is probably optimal for an exposure of about 400 milliseconds duration when the top layer photoresist material is made of a 1 micron layer of a suitable photoresist material herein-after more fully described.

Applicant's dye systems are also soluble in many typical carrier solvents used to make many bottom photoresist layer materials. Moreover, the dyes employed in this process are highly soluble over a wide range of concentrations (e.g., from about 1.0% to about 10% w/v) in, for example, chlorobenzene. Hence, such dyes also can be sufficiently concentrated in bottom layer resist materials to reduce substrate/resist interface reflections to acceptable levels. Typically, the intensity of i-line light reflected from substrate radiation in the disclosed processes will only be about 3% of the magnitude of the incident i-line light.

Furthermore, the herein disclosed dyes do not fluoresce at a wavelength that will expose the top layer. They are also extremely stable in the resist film during the bake cycles in which such photoresists are placed during typical photoetching production process. Moreover, the herein disclosed dyes will not crystallize when the carrier for the bottom layer material evaporates. This is of great practical advantage because if they were to so crystallize, non-uniform and potentially incomplete absorbtion would result. These dyes also are substantially transparent to the UV light which is a preferred form of non-i-line light used for exposing the bottom layer. If they were not transparent under these conditions, the exposure time required for the bottom layer might increase to a point where processing speeds would be seriously reduced. Another advantage of these dyes is that they also are, to a large degree transparent at some point within the visible wavelength range. This is a useful feature in that it facilitates alignment during projection printing. Finally, the herein disclosed i-line sensitive dyes do not contain elements such as sodium or potassium which would contaminate a semiconductor substrate.

All the above noted advantages can be obtained in i-line light photoetching processes employing dyes having butadiene or bromine substituted butadiene as their major active dye component. N,N′-Dibutyl-N,N′-Di (1-(4,4-dicyano-1,3-butadiene))-1,6-hexanediamine is a particularly preferred dye for the processes of this patent disclosure. In another particularly preferred embodiment of these processes, resist notching over topography or grainy substrate due to subsequent UV exposure of the bottom layer can be largely eliminated by introducing a second dye into the bottom layer. Such a second dye is intended to absorb in a different wavelength band, such as, for example, that of a UV source, which typically will be used to expose the bottom layer. By way of example coumarin dyes in general and coumarin 6 in particular are very effective in absorbing the UV light which is the preferred light source for exposing the bottom resist layer material and the methods disclosed in the 809 patent. For example a 1.3 micron layer of a polymethyl methacrylate bottom layer will preferably require from about 2000 to about 5000 (and preferably about 3800) millijoules per $cm^2$ of incident energy to properly expose said bottom layer of polymethyl methacrylate resist material.

It should also be noted that the processes of this invention can be applied to both single layer and multilayer photoresist processes. By multilayer processes applicant means those photoresist processes wherein the "top layer" and/or the "bottom layer" are themselves comprised of multilayers of photoresist materials and/or other materials such as dye layers. However, the processes disclosed herein are particularly well suited for use in PCM systems having a substrate such as a semiconductor material to be etched, a relatively thick bottom layer and a relatively thin top layer.

Figure 1A:
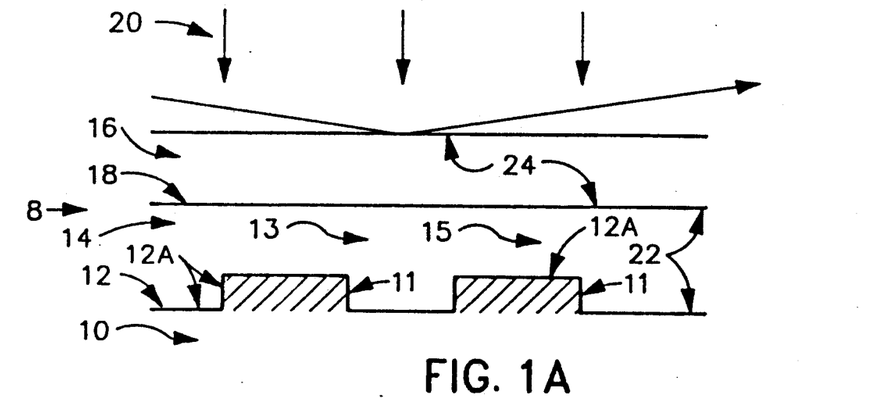
FIG. 1(a) illustrates the top layer exposure step of a PCM process being carried out on the herein disclosed photoresist system.

The top layer should of course be made of a photoresist material which is sensitive to i-line light. This material can also contain other substances such as an infrared (IR) dye as indicated in FIG. 1(a).

In certain preferred embodiments of this invention the top layer photoresist material is preferably comprised of a mono and/or dialkyl ether of ethylene glycol (or their derivatives) solvent and diazo napthoquinone on a novolac resin. The most preferred mono and/or dialkyl ethers of ethylene glycol (or their derivatives) used in making the top photoresist material are those marketed under the trademark Cellosolve ®. They include: butyl "Cellosolve" (ethylene glycol monobutyl ether), butyl "Cellosolve" acetate (ethylene glycol monobutyl ether acetate), "Cellosolve" acetate (ethylene glycol monoethyl ether acetate), "Cellosolve" solvent (ethylene glycol monoethyl ether), dibutyl "Cellosolve" (ethylene glycol dibutyl ether), n-hexyl "Cellosolve" (ethylene glycol monohexyl ether), methyl "Cellosolve" (ethylene glycol monomethyl ether), methyl "Cellosolve" acetate (ethylene glycol monomethyl ether acetate), and phenyl "Cellosolve" (ethylene glycol monophenyl ether).

A most preferred photoresist material for the top layer is KODAK 809 ®, a photoresist material comprised of a mono and/or dialkyl ether of ethylene glycol solvent, such as members of the Cellosolve ® series previously noted, and diazo napthoquinone on a novolac resin substrate. The bottom layer preferably is made of a photoresist material which is not sensitive to i-line light and which is also capable of dissolving the i-line light absorbing dyes used in these processes. Polymethyl methacrylate is particularly well suited to all of these purposes. Most preferably the bottom layer should also contain another dye which is capable of absorbing light of the wavelength used to expose the top layer. Hence a generalized version of this invention would constitute a photoetching process of the portable-conforming-mask (PCM) variety comprising: (1) depositing on a substrate, a bottom resist layer of a first photoresist material, which first photoresist is not sensitive to i-line light and which contains at least one dye whose chief light sensitive ingredient is selected from the group consisting of those butadiene dyes and bromine substituted butadiene dyes capable of substantially absorbing monochromatic light having a wavelength substantially at the i-line of the mercury spectrum (i-line light) and another dye, such as for example, a coumarin dye, such as for example, a coumarin dye which is capable of absorbing light of another wavelength, e.g., UV light, which may be used to expose the bottom layer, in order to produce a bottom resist layer having a substantially planar top surface; (2) depositing at least one top resist layer of a second photoresist material which is sensitive to i-line light in order to produce a top resist layer and a bottom photoresist layer sandwiched between the substrate and the top resist layer; (3) exposing the top resist layer to a monochromatic light source whose wavelength approximates that of the i-line of the mercury spectrum and which is not capable of substantially exposing the first photoresist material of the bottom resist layer and wherein said i-line light source is passed through a mask to expose only selected portions of the top resist layer; (4) developing the top resist layer to produce a portable-conformable-mask having a pattern; and (5) replicating the pattern of the portable-conformable-mask into the bottom resist layer containing the dye capable of absorbing i-line light by exposing said bottom resist layer, through a portable-conformable-mask produced in the top resist layer, to a light source other than i-line light which is capable of exposing the first photoresist material of the bottom layer and to which the remaining top layer material is opaque.

A more particular version of the process would constitute a photoetching process of the portable-conformable-mask (PCM) variety comprising: (1) depositing a bottom resist layer of a first photoresist material which is not sensitive to i-line light and which contains: (a) at least one dye whose chief light sensitive ingredient is selected from the group consisting of those butadienes and bromine substituted butadiene dyes capable of substantially absorbing monochromatic light having a wavelength substantially at the i-line of the mercury spectrum (i-line light) on a substrate and (b) at least one dye whose chief light sensitive ingredient is sensitive to a non-i-line light source used to expose the bottom resist layer in order to produce a bottom resist layer having a substantially planar top surface; (2) depositing at least one top resist layer of a second photoresist material which is sensitive to i-line light and a dye capable of absorbing light from a second light source used to expose the bottom resist layer in order to produce a top resist layer and a multilayer photoresist system having the bottom resist layer sandwiched between the substrate and the top resist layer; (3) exposing the top resist layer to a monochromatic light source whose wavelength approximates that of the i-line of the mercury spectrum and which is not capable of substantially exposing the first photoresist material of the bottom resist layer and wherein said i-line light source is passed through a mask to expose only selected portions of the top resist layer; (4) developing the top resist layer to produce a portable-conformable-mask having a pattern; and (5) replicating the pattern of the portable-conformable-mask into the bottom resist layer containing the dye capable of absorbing i-ling light by exposing said bottom resist layer, through the portable-conformable-mask produced in the top resist layer, to a light source other than i-line light which is capable of exposing the first photoresist material of the bottom layer and to which the top layer photoresist is opaque.

This more particular version of the process also works best when; (1) the dye capable of absorbing the i-line light is N,N'-Dibutyl-N,N'-Di(4,4'-dicyano-1,3-butadiene))-1,6-hexanediamine; (2) the top resist layer is KODAK 809 ®, (i.e., a photoresist material comprised of a Cellosolve ® [i.e., a mono and/or dialkyl ether of ethylene glycol] solvent and diazo naphthoquinone on a novolac resin backbone) and wherein said top resist layer also contains an IR (infra-red) light absorbing dye such, for example, a dye having the chemical structure:

which is sold under the trademark KODAK IR 140 ® by Eastman Kodak (Rochester, N.Y.), (3) the bottom resist layer is polymethyl methacrylate; (4) the other dye in the bottom resist layer is a coumarin dye and (5) the i-line light has a wavelength substantially at 365 nm. In this two dye bottom resist layer, the dye capable of absorbing the non-i-line light is most preferably coumarin 6. One particular advantage of using coumarin 6 as the ultraviolet light-absorbing dye in this system is that it bleaches well under exposure by a deep-ultraviolet light. As a result of this bleaching action exposure time for the bottom layer is reduced from that which would exist without bleaching and resolution is improved.

This invention also specifically contemplates the inherent disclosure and patent possibilities of photoresist systems, that is devices, as well as the above described photoresist etching processes.

DESCRIPTION OF THE DRAWINGS

The process details of some of the more preferred embodiments of this invention are illustrated in FIGS. 1 (items a through d), 2 and 3 (a and b). They are offered by way of example only and should not be considered as limitations on the more fundamental teachings of this patent disclosure.

FIG. 1 (items a through d) sequentially illustrates cross section views of the results of the disclosed i-line resist process carried out in the context of a portable-conformable-mask ("PCM") system. For example:

DESCRIPTION OF THE PREFERRED EMBODIMENTS

FIG. 1a shows the initial state of a representative PCM system 8 constructed according to the teachings of this patent disclosure. A substrate 10 is shown with irregularities 11 on its top surface 12. Substrate 10 is covered by a relatively thick bottom layer 14 of a first photoresist material such as polymethyl methacrylate. The presence of a dye capable of absorbing i-line light and dissolved in bottom layer 14 is depicted by the presence of number 13 in bottom layer 14. Similarly, the presence of a dissolved dye capable of absorbing UV light in the bottom layer 14 is depicted by number 15. The interface between substrate 10 and bottom layer 14 is generally designated as interface 12A. Bottom layer 14 is in turn covered with a relatively thin top layer 16. The interface between bottom layer 14 and top layer 16 is generally designated as interface 18. Incident, i-line light 20 is shown impinging on top layer 16. Preferably, the thickness 22 of bottom layer 14 is greater than the thickness 24 of top layer 16. In process terms, the dye 13 (e.g., N,N'-Dibutyl-N,N'-Di(1-(4,4-dicyano-1,3-butadiene)-1,6-hexanediaamine) shown in FIG. 1(a) will be capable of reducing or eliminating problems caused by light reflections from substrate/bottom resist layer interface 12A. The bottom resist layer 14 for the disclosed i-line system can be any photoresist material in which the i-line absorbing dyes of this invention can be dissolved. However, polymethyl methacrylate (also known as PMMA and available from DuPont Company, Wilmington, Del. 1989) is a highly preferred photoresist material for bottom layer 14. Among its other virtues, it can also readily dissolve the i-line absorbing dyes used in this invention. Optionally, dye 13 can represent more than one of the herein disclosed dyes capable of absorbing i-line light. Dye 13 can also be used in conjunction with other dyes such as, for example, those capable of absorbing UV light. For example, a polymethyl methacrylate bottom layer 14 can be doped with 2.6% coumarin 6 laser dye (manufactured by Eastman Kodak Company, Rochester, N.Y. 14650) in the manner taught by the 809 patent. Bottom layer 14 should be thick enough (e.g., approximately 1.5 microns) to produce a substantially planar interface 18 between bottom layer 14 and top layer 16. Typically the bottom layer 14 in the herein disclosed system will be baked for about 1 minute at about 175° C. as part of the overall manufacturing process. The relatively thin (e.g., less than 1 micron) top resist layer 16 is also intended to depict a photoresist material which is sensitive to i-line mercury light, e.g., that from a lamp source. Again, Applicant has found that KODAK 809 ® (i.e., a photoresist material comprised of a CELLOSOLVE ® [i.e., a mono and/or dialkly ether of ethylene glycol] solvent and diazo naphthoquinone on a novolac resin substrate backbone, makes an excellent photoresist material for the practice of this invention. It has the proper light sensitivity and will dissolve certain other materials, such as infra-red (IR) dyes, which also may be helpful to the overall process of this patent disclosure. For example, the second photoresist material may comprise about 2 grams of KODAK IR-140 ® CAS Registry Number 3655-17-7, for every liter of KODAK 809 ® photoresist. Again, the Eastman Kodak IR-140 ® dye has the chemical structure:

and has a maximum absorptivity of $15.60 \times 10^4$ L/cm/mole in DMSO at 823 nm and a molecular weight of 779.21. KODAK IR-140 ® has a maximum absorptivity of approximately $14 \times 10^4$ in a KODAK 809 ® photoresist. Moreover, such a photoresist material also can be readily deposited on many representative bottom layer 14 photoresist materials. It also has the added advantage of being opaque in the 200-250 nm region where the preferred bottom layer 14 material, PMMA, is sensitive so that after development, top layer 16 can act as a contact mask for bottom layer 14. A KODAK 809 ® top layer 16 material is preferably baked at about 82° C. for about 1 minute before exposure to pattern the top layer.

FIG. 1(a) is also intended to illustrate in process terms the way in which the top layer 16 is exposed to an i-line light source, preferably by means of a projection printer not shown. As previously noted, PMMA is not sensitive at this wavelength so that the 365 nm light is only effective in exposing the top resist layer 18. By way of example only, at an exposure intensity of about 400 millijoules/cm², the i-line light absorbing dye should be sufficiently concentrated (e.g., from about 2% to about 6% with an optimal concentration at about 3%) in the bottom layer, and should be sufficiently absorptive at a 365 plus or minus 25 nm wavelength, such that at least about 80% of the light entering bottom layer 14 is absorbed in a single pass through said bottom layer. The absorption band of the i-line absorbing dye 13 and the UV absorbing dye 15 (e.g., coumarin 6) preferably should be somewhat narrow (see for example FIG. 2). Such dyes should not however significantly absorb in the visible range so that the presence of dye 13 and/or dye 15 do not significantly interfere with any viewing alignment marks on the substrate during projection printing alignment.

Figure 1B:
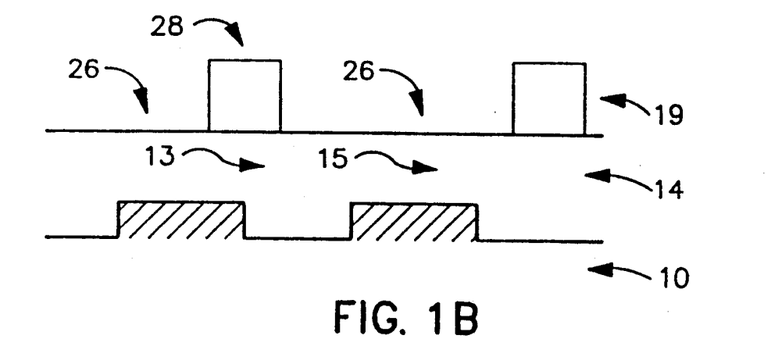
FIG. 1(b) illustrates effect of developing the top layer of the PCM system.

FIG 1(b) shows the results of developing portions of top layer to produce a top layer pattern 19 and 28. It is also intended to depict that an absorption of the 365 nm light by a suitable dyed bottom resist layer 14 improves the linewidth resolution in the top layer 16 by reducing reflections from interface 12A between the substrate 10 and the bottom resist layer 14. It is also intended to depict that good linewidth control is preserved when top layer 16 is developed to produce the portable conformable mask. A top layer 16 of a photoresist material such as KODAK 809 ® can be developed by various known methods including immersion for about 90 seconds in KODAK 809 ® developer followed by a rinse with deionized water.

Figure 1C:
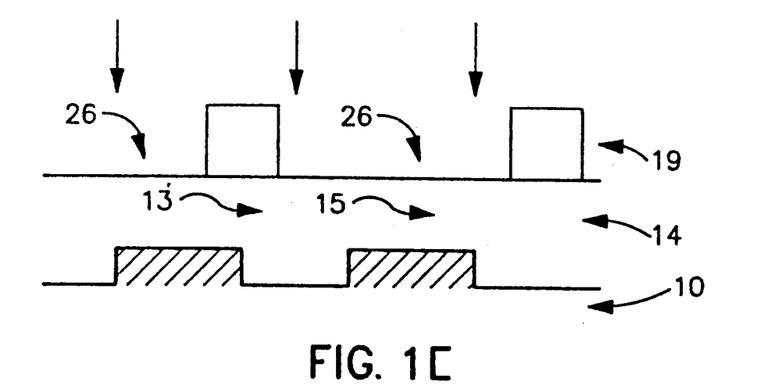
FIG. 1(c) illustrates a UV flood exposure of the bottom layer using the top layer as a PCM i.e., it illustrates the resist pattern which results from a process carried out in accordance with the herein disclosed invention wherein the top resist layer is used as a pattern during development of the bottom layer.

FIG. 1(c) shows bottom layer 14 being exposed to a non-i-line light such as UV light 21 through developed regions such as those indicated by FIGS. 26 in the top resist layer 16. Such a light 21 could, for example, represent a deep-ultraviolet light with an intensity of say 25–30 mW/cm$^2$ supplied from some appropriate source such as by a 1000 W Hg-Xe short arc lamp (not shown) or a microwave pumped UV source (again, not shown).

Figure 1D:
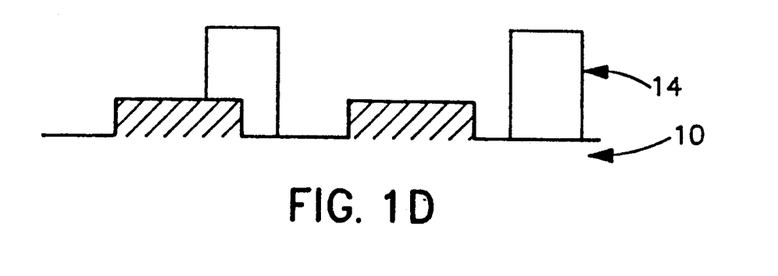
FIG. 1(d) illustrates a version of the process wherein the top layer PCM is stripped and the bottom layer developed i.e., it illustrates the resist pattern which results from a process in accordance with the disclosed invention in which the top resist layer has been removed during development of the bottom layer.

FIG. 1(d) depicts that bottom layer 14 can accurately replicate a top layer pattern 19. This follows from a number of reasons. First, such a broad band deep-ultraviolet exposure of the bottom layer 14 would reduce standing wave and resonance effects within bottom layer 14. Secondly, the reflectivity of most semiconductor substrate materials decreases at the deep-ultraviolet wavelengths used for say an exposure of PMMA. In addition, the frequencies employed herein tend to reduce diffraction and result in a high contrast exposure of bottom layer 14. To preserve this high contrast it is important that dye 13 not absorb strongly at the high frequencies employed in such a PMMA exposure. Coumarin unfortunately does absorb somewhat in the 220–250 nm region, but its concentration can be controlled independently of dye 13 to prevent the aforesaid resist notching, but yet not degrade linewidth resolution or increase the required exposure dose. For example, with about a factor of two increase in ultraviolet exposure time, a dyed PMMA produces the same vertical sidewalls as an undyed PMMA. Again by way of example, a polymethyl methacrylate bottom layer can be developed by a succession of immersions in say a 100% solution of methyl isobutylketone (MIBK) for 90 seconds in a 25% solution of MIBK in isopropanol for 90 seconds and in a 100% solution of isopropanol for 60 seconds followed by a rinse with deionized water. Other developers, such as chlorobenzene, which could be used to develop bottom layer 14, also will leave top layer 16 intact if this is a desired end result.

EXPERIMENTAL METHODS AND EQUIPMENT

Lenses. A series of lenses were classified on the basis of resolution, field size, operating wavelength, reduction ratio, and field distortion. Since each lens is available with specific combinations of focus, leveling, and alignment control systems, they were evaluated within the framework of their associated stepper subsystems. In this context, the performance of each lens was examined across the full three dimensional envelope of its image field. In selecting the exposure tool, attention was also devoted to software, vendor support, and system reliability. In order to maximize process control margins lenses were evaluated with reference to the focus subsystem of the associated stepper. This evaluation took into account process topography, wafer warpage, bow and taper. A budget of the various factors affecting the depth of image field is presented in Table I.

TABLE I

| An example of the Focus Budget for the Process | | |
|---|---|---|
| A | Worst case topography | 0.56 |
| B | Wafer warpage | 0.25 |
| C | Wafer taper | 0.45 |
| D | Wafer bow | 0.10 |
| E | Lens aberration (typical) | 0.50 |
| A + C + D + E + RMS(B) | | 1.60 |

Table II lists various lenses which could be used in this process. For each lens, the calculated depth of focus is shown. Investigation showed that this derived value was close to the measured result for most of these lenses. To obtain the operating focus margin for each lens, the focus budget for the process was subtracted from the derived depth of focus. This result is also shown in Table II.

TABLE II

| | | | High Resolution Microlithographic Lenses | | | | | | |
|---|---|---|---|---|---|---|---|---|---|
| Vendor | Lens | NA | Useful resol (um) | DOF TIR (um) | Focus margin | Field mm × mm | 10× or 5× | Pixels million | Stepper vendor |
| g-line | | | | | | | | | |
| Zeiss | 107782 | .28 | 1.3 | 5.6 | 3.5 | 10 × 10 | 10× | 64 | GCA |
| Zeiss | 107846 | .38 | 0.9 | 3.0 | 1.2 | 14 × 14 | 5× | 233 | GCA |
| Nikon | 5A2 | .35 | 1.0 | 3.6 | 1.5 | 15 × 15 | 5× | 227 | Nikon |
| Nikon | 5A3 | .42 | 0.8 | 2.4 | 1.1 | 15 × 15 | 5× | 326 | Nikon |
| h-line | | | | | | | | | |
| Zeiss | 107815 | .28 | 1.2 | 5.2 | 3.1 | 15 × 15 | 5× | 168 | PE/Censor |
| Wild | #1 | .35 | 0.9 | 3.3 | 1.7 | 17 × 17 | 5× | 337 | PE |
| i-line | | | | | | | | | |
| Zeiss | 107834 | .32 | 0.9 | 3.7 | 1.6 | 8 × 8 | 10× | 81 | GCA, TRE |
| Nikon | 1010i | .35 | 0.8 | 3.0 | .9 | 10 × 10 | 10× | 144 | Nikon |
| Zeiss | 107848 | .42 | 0.7 | 2.0 | .5 | 10 × 10 | 10× | 207 | GCA |
| Zeiss | 107852 | .32 | 0.9 | 3.6 | 2.0 | 16 × 16 | 5× | 307 | GCA, ASM |
| Tropel | 2235I | .35 | 0.8 | 3.0 | 1.4 | 15 × 15 | 5× | 323 | GCA |

It is evident that the above noted focus margins are very tight. Consequently, the resolution of each lens was examined across its full field using wafers with simulated topography. Several steps were taken to improve the available focus margin. A low backside contact silicon pin-chuck improved the utilization of the margin. It also significantly reduced the incidence of particle-induced problems between the wafer and the chuck. It was evident that auto-wafer-leveling increases the focus margin. The inclusion of an infra-red absorbing dye such as coumarin 6 in the imaging resist removed spurious reflections from the bottom layer 14 and thereby improving the performance of the IR sensing focus control subsystem.

Applicant has found that the 5X and 10X i-line lenses represent a significant improvement in resolution and circuit density (number of pixels) over current g-line lenses. For this pilot process the 0.32 NA Zeiss 107834 was found to be a particularly convenient test bed lens for prototype process development. A test bed system was configured using a GCA 4800 stepper frame along with a Zeiss 107834 lens and a GCA Autofocus II focus control subsystem. The test bed was retrofitted with a low back-side contact chuck. The test bed had a prototype i-line light source. Initially, the i-line filter initially employed deteriorated under the UV flux. This filter was redesigned to first block the deep UV radiation so that the long wavelength filter and the i-line passing interference stack will not develop color centers or thermally degrade.

I-Line Photoresist. Applicant's greatest problem was the lack of a suitable i-line resist material and dyes suitable for use in systems using an i-line light source. Again, Applicant found that even though some single layer resists are purportedly designed for i-line, they proved to be either insufficiently sensitive at the i-line wavelength, and/or unstable during post exposure bake procedures. Consequently, resist and dyes especially suited to i-line systems had to be found or developed in order to achieve high quality results.

The i-line PCM requires an i-line sensitive imaging top layer and applicant found that a mono and/or dialkyl ether of ethylene glycol solvent, diazo naphthoquinone, novolac resin photoresist system such as KODAK 809 ® photoresist is quite sensitive at the 365 nm i-line peak of the mercury spectrum. Moreover, after exposure and a subsequent develop step, a patterned layer of such a photoresist can be used as the portable-conformal-mask (PCM) for UV flood exposure of the bottom layer of the multilayer resist processes and devices described in this patent disclosure.

One of the more salient features of this particular PCM process was suppression of standing waves in the imaging layer. As previously noted, it is known that inclusion of an effective i-line absorbing dye in the bottom layer can eliminate standing waves in the top layer. Table III lists the key properties that such a dye must exhibit to be used effectively in an i-line light application. Hence, Applicant's experiments were aimed.

TABLE III

List of Properties for an I-Line Light Resist Dye
The i-line resist dye must possess the following properties for use in the PCM process:

1. A high coefficient of absorption at the i-line exposure wavelength. (365 nm plus or minus 25 nm or plus or minus about 5 nm when appropriate filters are employed).
2. Sufficient solubility in the carrier solvent of the bottom layer so that the intensity of the emergent reflected i-line radiation is about 3% the magnitude of the incident.
3. The i-line resist dye fluoresces at the i-line wavelength used to expose the top layer.
4. The ability to remain stable in the resist film during the bake cycle.

Figure 2:
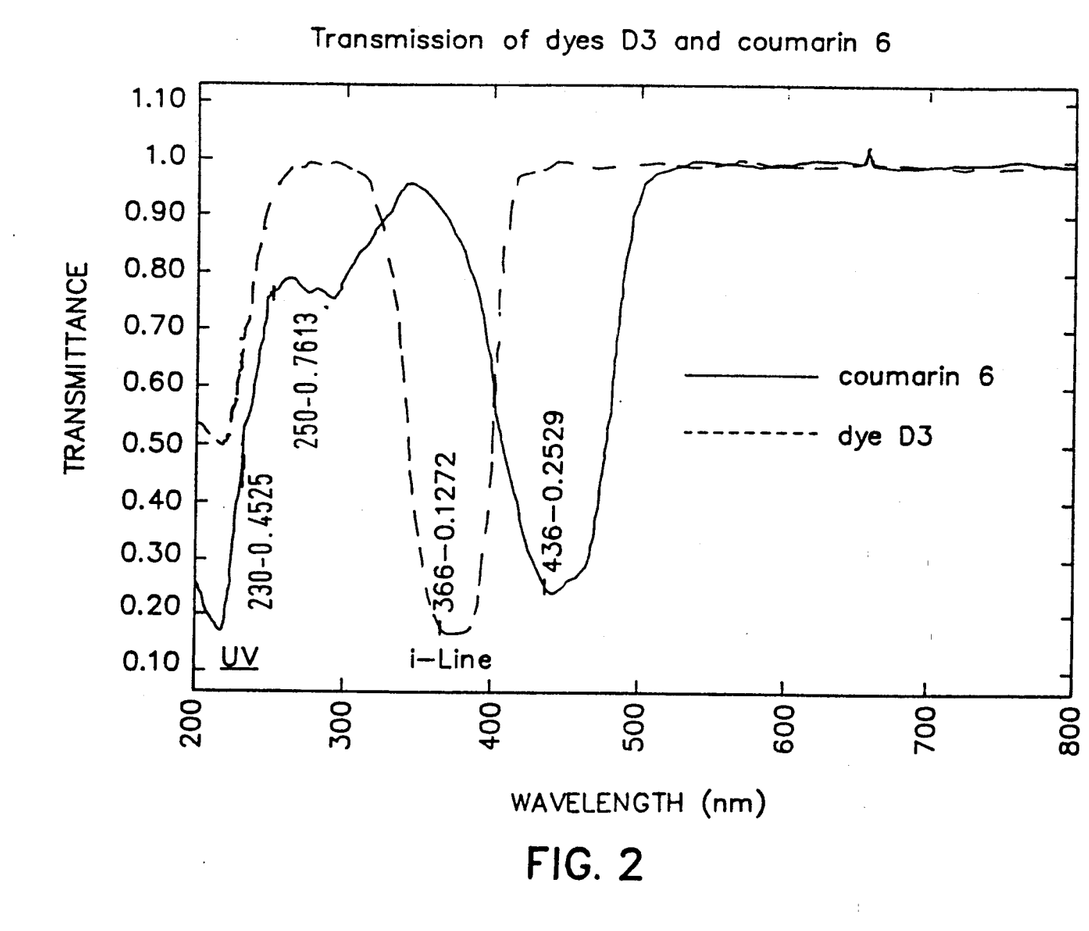
FIG. 2 illustrates the transmission characteristics of a representative i-line sensitive and a representative UV sensitive dye which can be used in a preferred embodiment of the more fundamental processes disclosed in this invention.
Figure 3A:
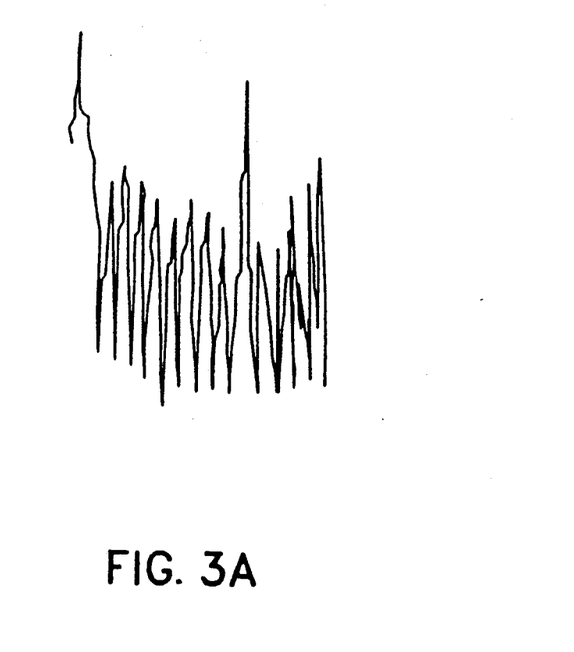
FIG. 3 (items a and b) illustrates and compares the effect of putting an IR dye in the top resist.
Figure 3B:
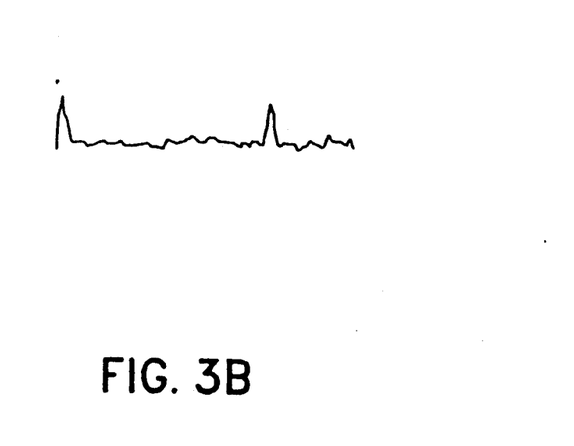

As previously noted, no off-the-shelf dye met applicant's i-line application requirements. Therefore some special dyes were developed for applicant by Eastman Kodak Company. Generally speaking these dyes have butadiene and/or substituted butadiene as their active i-line light absorbing ingredient. Other ingredients known to the dye making art may also be employed in conjunction with these active ingredient dyes. In any event, one such dye proved to be particularly effective. It was produced after several iterations. Eastman Kodak: has designated this dye "D-3" and its chemical formula is N,N'Dibutyl-N,N'-Di(1-(4,4-dicyano-1,3-butadiene))-1,6-hexanediamine. The absorption spectrum of D3 in solution in a representative bottom layer film is shown in FIG. 2 which also depicts the absorption spectrum of coumarin 6. The use of a dye capable of absorbing UV light in the bottom layer photoresist is highly preferred, because during the course of the experimental work leading to this invention, applicant found that intense UV exposure of the bottom layer can result in resist notching over topography or grainy substrate. Applicant found that this notching can be eliminated in the context of an i-line light system by introducing a UV light absorbing dye into the bottom layer. That is to say this second dye is intended to absorb in the wavelength band of a UV exposure when UV light is the non-i-line light employed to expose the bottom layer. Known UV absorbing dyes such as coumarin dyes serve this purpose rather well. Coumarin 6, a laser dye, is particularly preferred for its ability to absorb in the UV exposure band. It also has some of the other sought after properties listed in Table III regarding desired properties in an i-line absorbing dye. Additionally, coumarin 6 fluoresces at about 515 nm. This property can be harnessed to another end in a manner detailed in the next paragraph of this patent disclosure. Again, FIG. 2 shows the absorption spectrum of coumarin 6 along with the absorption spectrum of Kodak D3.

Critical Dimension Metrology. A good critical dimension metrology (CD) technique is necessary both for process development, and also for process monitoring and control in production. For submicron lithography with a control specification of $\pm/10\%$, CD metrology using SEM pictures of gold-coated wafers appears to be most effective. It is clear that withdrawing wafers from run lots at each masking level for this approach is unacceptable. On the other hand, in-room SEM inspection tools appear to damage UV resists. Applicant employed a technique using dye fluorescence to measure critical dimensions. Since one preferred embodiment of Applicant's i-line PCM process uses coumarin 6 as an anti-notching dye, its 515 nm fluorescence was used with this tool. The precision of the fluorescence tool for a given substrate is $\pm0.04$ micron, a substantial portion of the CD budget. However, the PCM process has extremely good CD control. The total CD budget is given in Table IV.

TABLE IV

The Critical Dimension Budget. This i-line CD budget is based on the results of factorial experiments in an existing production process. Measurements, and in some cases projections, were used to obtain the numbers. All values are in microns.

| ITEM | +/− VARIATION (3 sigma) |
|---|---|
| Surface Reflection | 0.010 |
| Bottom Layer Thickness | 0.030 |

| ITEM | +/− VARIATION (3 sigma) |
| --- | --- |
| Bottom Layer Softbake Temperature | 0.010 |
| Bottom Layer Softbake Time | 0.000 |
| Top Layer Thickness | 0.014 |
| Top Layer Softbake Temperature | 0.035 |
| Top Layer Softbake Time | 0.000 |
| Top Layer Develop Temperature | 0.013 |
| Top Layer Develop Time | 0.009 |
| Top Layer Developer Concentration | 0.020 |
| Top Layer Developer Agitation | 0.000 |
| Flood deep UV dose | 0.020 |
| Flood Deep UV dose matching | 0.025 |
| Bottom Layer Develop Temperature | 0.005 |
| Bottom Layer Develop time | 0.006 |
| Exposure to Ambient Light | 0.020 |
| Delay Coat to Expose | 0.030 |
| Delay Expose To First Develop | 0.030 |
| Delay First Develop to Floor Expose | 0.018 |
| Resist Contribution | 0.082 |
| Exposure Field Intensity Uniformity | 0.030 |
| Top Layer Exposure Dose | 0.030 |
| Pellicle Thickness | 0.030 |
| Reticle Dimensional Tolerance | 0.025 |
| Exposure Tool Contribution | 0.058 |
| Total Budget | 0.100 |

Test Results. The performance of the i-line pilot process utilizing a Zeiss 107834 lens-based test bed and an i-line PCM resist was particularly effective in showing the viability of this i-line, photoresist process. The data presented was collected while processing several test chips over a period of about one year. These chips have minimum feature sizes of either 0.7 or 0.9 micron. The wafer job lots typically consist of between 25 and 50 wafers. This work shows that the disclosed PCM resist produces vertical line profiles and yet is tolerant to underlying topography and variations in reflectivity. However, it also should be noted that the herein disclosed PCM processes have several extra steps when compared to a standard single layer process, however these steps in the disclosed PCM processes have significantly wider margins than those in a comparable single layer process. Moreover, the disclosed system is capable of dealing with some of the most difficult masking levels e.g., polysilicon gates, metal interconnects and the via encountered in the photoetching art. In such figures, applicant's resist profiles remain vertical as the resist lines cross features on the substrate.

Those skilled in the art will appreciate that many obvious modifications could be made in the basic teachings of this patent disclosure without departing from its scope and spirit. By way of example, only, it should be understood that the primary requisite for the top layer is that it be a photoresist material which is sensitive to i-line light. The chemical composition of this material is of secondary importance. Similarly, the primary characteristic of the bottom layer is that it be a photoresist which is capable of dissolving the disclosed i-line absorbing dyes. Preferably it also should be chemically different from the photoresist material of the top layer. Finally, the single most important features of the butadiene or substantial butadiene dyes disclosed herein are that they absorb i-line light to a high degree, are readily dissolved in the bottom layer photoresist material and stand up to baking processes to which the photoresist material is subjected.

I claim:
1. A photoresist system comprising:
   (1) a semiconductor substrate;
   (2) a bottom resist layer which is deposited on the semiconductor substrate and wherein said bottom resist layer is polymethyl methacrylate into which dyes selected from the group consisting of N,N'-Dibutyl-N,N'-Di(4,4'-dicyano-1,3-butadiene))-1,6-hexanediamine, and coumarin 6 have been dissolved; and
   (3) a top resist layer which is deposited on the bottom resist layer and wherein said top resist layer is comprised of (1) a solvent selected from the group consisting of monoalkyl ethers of ethylene glycol and dialkyl ethers of ethylene glycol and (2) diazo napthoquinone on a (3) novolac resin substrate into which a dye having the structure:

has been dissolved.

2. A photoresist system comprising:
   (1) a substrate;
   (2) a bottom resist layer which is deposited on the substrate and wherein said bottom resist layer is made of a first photoresist material which is not sensitive to i-line light and which contains: (a) at least one dye whose chief light sensitive ingredient is selected from the group consisting of those butadiene dyes and bromine substituted butadiene dyes capable of substantially absorbing monochromatic light having a wavelength substantially at the i-line of the mercury spectrum (i-line light) and (b) at least one other dye which is capable of absorbing the light source other than i-line light and wherein said first photoresist material has a substantially planar top surface; and
   (3) a top resist layer deposited on the bottom resist layer and wherein said top resist layer is made of a second photoresist material which is sensitive to i-line light.

3. The photoresist system of claim 2 wherein the top resist layer further comprises a dye capable of absorbing IR light.

4. A photoetching process of the portable-conformable-mask (PCM) variety comprising:
   1) depositing on a semiconductor substrate, a bottom resist layer of a first photoresist material, wherein said first photoresist material is not substantially sensitive to i-line light and contains: (a) at least one dye whose chief light sensitive ingredient is selected from the group consisting of those butadienes and bromine substituted butadiene dyes capable of substantially absorbing monochromatic light having a wavelength substantially at the i-line of the mercury spectrum (i-line light) and (b) at least one dye whose chief light sensitive ingredient is sensitive to a non-i-line light source used to expose the bottom resist layer, in order to produce a bottom resist layer having a substantially planar top surface;

(2) depositing a top resist layer of a second photoresist material which is comprised of (1) a solvent selected from the group consisting of monoalkyl ethers of ethylene glycol and dialkyl ethers of ethylene glycol and (2) diazo naphthoquinone on a (3) novolac resin substrate backbone, which is sensitive to i-line light, and which contains a dye having the chemical structure:

capable of absorbing an infra-red light source in order to produce a top resist layer and a photoresist system wherein the bottom resist layer is sandwiched between the substrate and the top resist layer;

(3) exposing the top resist layer to a monochromatic light source whose wavelength approximates that of the i-line of the mercury spectrum and which is not capable of substantially exposing the first photoresist material of the bottom resist layer and wherein said i-line light source is passed through a mask to expose only selected portions of the top resist layer;

(4) developing the top resist layer to produce a portable-conformable-mask having a pattern; and (5) replicating the pattern of the portable-conformable-mask into the bottom resist layer containing the dye capable of absorbing i-line light by exposing said bottom resist layer, through the portable-conformable-mask produced in the top resist layer, to a light source, other than i-line light, which is capable of exposing the first photoresist material of the bottom layer.

5. The process of claim 4 wherein the dye capable of absorbing the i-line light is N,N'-Dibutyl-N,N'-Di(4,4'-dicyano-1,3-butadiene))-1,6-hexanediamine and the dye capable of the absorbing the non-i-line light is coumarin 6.

6. A photoetching process of the portable-conformable-mask (PCM) variety comprising:

(1) depositing on a semiconductor substrate, a bottom resist layer of a first photoresist material, wherein said first photoresist material is not substantially sensitive to i-line light and contains: (a) at least one dye whose chief light sensitive ingredient is selected from the group consisting of those butadienes and bromine substituted butadiene dyes capable of substantially absorbing monochromatic light having a wavelength substantially at the i-line of the mercury spectrum (i-line light) and (b) at least one dye whose chief light sensitive ingredient is sensitive to a non-i-line light source used to expose the bottom resist layer, in order to produce a bottom resist layer having a substantially planer top surface;

(2) depositing a top resist layer of a second photoresist material which is sensitive to i-line light and which contains a dye capable of absorbing an infra-red light source in order to produce a top resist layer and photoresist system wherein the bottom resist layer is sandwiched between the substrate and the top resist layer;

(3) exposing the top resist layer to a monochromatic light source whose wavelength approximates that of the i-line of the mercury spectrum and which is not capable of substantially exposing the first photoresist material of the bottom resist layer and wherein said i-line light source is passed through a mask to expose only selected portions of the top resist layer;

(4) developing the top resist layer to produce a portable-conformable-mask having a pattern; and (5) replicating the pattern of the portable-conformable-mask into the bottom resist layer containing the dye capable of absorbing i-line light by exposing said bottom resist layer, through the portable-conformable-mask produced in the top resist layer, to a light source, other than i-line light, which is capable of exposing the first photoresist material of the bottom layer.

7. The process of claim 6 wherein the i-line light has a wavelength substantially at 365 nm.

* * * * *